United States Patent
Chen et al.

(10) Patent No.: US 6,277,699 B1
(45) Date of Patent: *Aug. 21, 2001

(54) METHOD FOR FORMING A METAL-OXIDE-SEMICONDUCTOR TRANSISTOR

(75) Inventors: Coming Chen, Taoyuan Hsien; Wen-Kuan Yeh, Chupei; Jih-Wen Chou, Hsinchu, all of (TW)

(73) Assignee: United Microelectronics Corp., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/187,140

(22) Filed: Nov. 6, 1998

(51) Int. Cl.$^7$ .................................................. H01L 21/335
(52) U.S. Cl. ......................... 438/303; 438/595; 438/653; 438/305; 438/592
(58) Field of Search .................................... 438/303, 305, 438/592, 595, 653; 257/413, 915, 344, 401, 408

(56) References Cited

U.S. PATENT DOCUMENTS

| | | | | |
|---|---|---|---|---|
| 4,963,504 | * | 10/1990 | Huang | 437/44 |
| 5,015,599 | * | 5/1991 | Verhaar | 437/44 |
| 5,162,884 | * | 11/1992 | Liou | 257/384 |
| 5,276,347 | * | 1/1994 | Wei | 257/388 |
| 5,304,504 | * | 4/1994 | Wei et al. | 437/44 |
| 5,585,295 | * | 12/1996 | Wu | 437/44 |
| 5,759,900 | * | 6/1998 | Suh | 438/305 |
| 5,798,279 | * | 8/1998 | Crisenza | 437/43 |
| 5,837,588 | * | 11/1998 | Wu | 438/305 |
| 5,880,508 | * | 3/1999 | Wu | 257/411 |
| 5,925,918 | * | 7/1999 | Wu | 257/413 |
| 5,928,918 | * | 7/1999 | Wu et al. | 257/413 |
| 6,057,576 | * | 5/2000 | Hsia | 257/344 |
| 6,083,816 | * | 7/2000 | Kanamori | 438/585 |
| 6,107,171 | * | 8/2000 | Tsai | 438/584 |

\* cited by examiner

*Primary Examiner*—Mary Wilczewski
*Assistant Examiner*—David Goodwin
(74) *Attorney, Agent, or Firm*—Thomas, Kayden, Horstemeyer & Riley, LLP

(57) ABSTRACT

A method for forming a MOS transistor is provided. A gate oxide layer, a polysilicon layer, a barrier layer and a conductive layer are sequentially formed on a provided substrate. A photolithography and etching process is carried out to remove a portion of the conductive layer and a portion of the barrier layer until exposing the polysilicon layer. An ion implantation is performed to form lightly doped regions in the substrate using the remaining conductive layer and the remaining barrier layer as a mask. A spacer is formed on the side-wall of the conductive layer and on the side-wall of the barrier layer. The polysilicon layer and the gate oxide layer, which are in positions other than those of the remaining conductive layer and the spacer, are removed. The remaining conductive layer and the remaining polysilicon layer constitute a gate with an inversed, T-shaped cross-section. Source/drain regions comprising the lightly doped regions are formed in the substrate by ion implantation using the gate structure as a mask.

16 Claims, 2 Drawing Sheets

METHOD FOR FORMING A METAL-OXIDE-SEMICONDUCTOR TRANSISTOR

BACKGROUND OF THE INVENTION

1. Field of the Invention

The invention relates in general to the fabrication of semiconductor integrated circuits (ICs), and more particularly to a method for forming a metal-oxide-semiconductor (MOS) transistor having a metal gate.

2. Description of the Related Art

A MOS transistor including stacked films and layers made of metal, oxide, and semiconductor is nowadays the most important device in the VLSI fabrication process, wherein the most popular semiconductor material used in a modern MOS transistor is silicon. Even though aluminum is used to form metal layers in most semiconductor devices, it cannot be used to form metal layers in a MOS transistor because aluminum causes fabrication problems in a high temperature environment. On the other hand, because most metals other than aluminum have a poor adhesion to silicon oxide, polysilicon has an excellent adhesion to silicon oxide and is currently used to replace metals in semiconductor fabrication process. However, using polysilicon to replace metal leads to a problem that the resistance of polysilicon, or even doped polysilicon, is too high to be used as metal in a MOS transistor. A conventional resolution to the forgoing problem is to form an extra metal silicide layer on the polysilicon to reduce the resistance of the polycide gate.

When the integration of an integrated circuit increases, the sheet resistance of the drain and source of the metal oxide semiconductor (MOS) transistor increases until the sheet resistance matches the channel resistance of the MOS transistor. To bring down the sheet resistance of the drain and the source of the MOS transistor and to ensure the integrity of a shallow junction between metal and MOS, salicide has been increasingly applied to the fabricating procedure.

For forming a conventional MOS transistor having salicide layer, the application of salicide is used to form a metal silicide layer on a polysilicon gate of the MOS transistor to decrease resistance of the gate of the MOS transistor.

FIG. 1 is a cross-sectional view showing a conventional MOS transistor. An isolating region 102 is formed on a substrate 100 to separate active regions of the substrate 100. A gate oxide layer 104 and a polysilicon gate 106 are formed on the substrate 100. Source/drain regions are formed in the substrate 100. A channel region of a MOS transistor is thus determined. The source/drain region of a conventional MOS transistor is normally replaced with a lightly doped drain (LDD) region to eliminate the hot carrier effect caused by the short channel effect. To form a MOS transistor with the LDD region normally comprises forming lightly doped regions 108 in the substrate 100. A spacer 110 is formed on the sidewalls of the polysilicon gate 106. Heavily doped regions as source/drain regions 112 are formed in the substrate 100 using the polysilicon gate 106 and the spacer 110 as a mask.

In order to reduce the resistance of the polysilicon gate 106 and the source/drain regions 112, metal silicide 118 and 120 are formed over the polysilicon gate 106 and the source/drain regions 112 by performing a salicide process. However, when the foregoing fabrication process is applied to a semiconductor device whose design rule is at a deep submicron level, a lower resistance and a shallower junction of a MOS transistor than those of the conventional MOS transistor are required. The salicide process has problems when forming a MOS transistor with lower resistance and a shallower junction. One of the problems is that salicide formed within the source/drain regions directly contacts the substrate in the shallower junction. Devices having a MOS transistor such as described above suffer failure from shorts between the substrate and the salicide.

SUMMARY OF THE INVENTION

It is therefore an object of the invention to provide a method of forming a MOS transistor with a metal gate. The gate of the MOS transistor comprises a metal layer and a polysilicon layer. The source/drain regions are formed by ion implantation through the polysilicon layer to obtain a shallower junction than a conventional junction. The polysilicon layer used as a part of the gate is thinner than a conventional poly-gate so that an etching window of the polysilicon layer is large to form properly a MOS transistor with a thin oxide layer.

To achieve these and other advantages and in accordance with the purpose of the invention, as embodied and broadly described herein, the invention provides a method for forming a MOS transistor. A gate oxide layer, a polysilicon layer, a barrier layer and a conductive layer are sequentially formed on a provided substrate. A photolithography and etching process is carried out to remove a portion of the conductive layer and a portion of the barrier layer until the polysilicon layer is exposed. An ion implantation is performed to form lightly doped regions in the substrate using the remaining conductive layer and the remaining barrier layer as a mask. A spacer is formed on the side-wall of the conductive layer and on the side-wall of the barrier layer. The polysilicon layer and the gate oxide layer, which are in positions other than those of the remaining conductive layer and the spacer, are removed. The remaining conductive layer and the remaining polysilicon layer constitute a gate structure with an inversed, T-shaped cross-section. Source/drain regions comprising the lightly doped regions are formed in the substrate by ion implantation using the gate structure as a mask.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1:
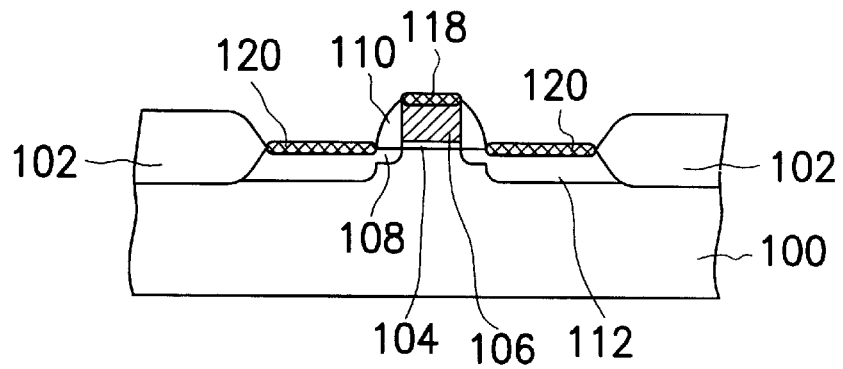
FIG. 1 is a schematic, cross-sectional view showing a conventional MOS transistor.
Figure 2A:
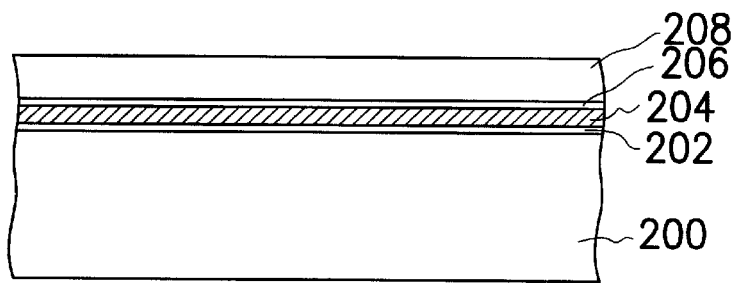
FIGS. 2A–2F are schematic, cross-sectional views showing the process of one preferred embodiment of the method for forming a MOS transistor.

As shown in FIG. 2A, a substrate 200 with a first electric type is provided. A gate oxide layer 202 is formed on the substrate 200. A polysilicon layer 204 with a thickness of about 300–1000 Å is formed on the gate oxide layer. A barrier layer 206, such as a titanium nitride layer, is formed on the polysilicon layer 204. A conductive layer 208 is formed on the barrier layer 206. The barrier layer 206 has a thickness of about 200–500 Å. The barrier layer 206 is not only used to disrupt diffusion between the conductive layer 208 and the polysilicon layer 204, but also used as an etching stop layer. The conductive layer 208 must have a low resistance. A preferred material of the conductive layer 208 is tungsten (W).

Figure 2B:
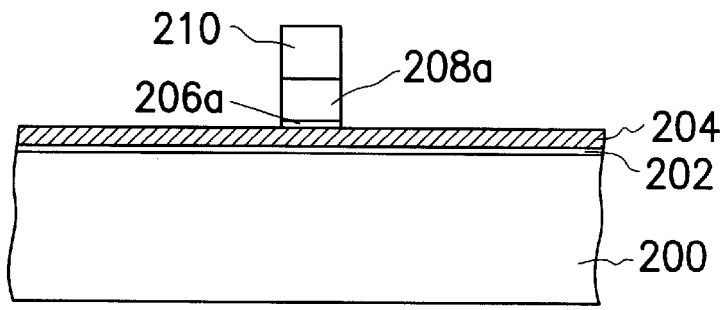

In FIG. 2B, a patterned photoresist layer 210 is formed on the conductive layer 208. According to the patterned photoresist layer 210, a portion of the conductive layer 208 is removed using the barrier layer 206 as the etching stop layer. A part of the barrier layer 206 not covered by the conductive layer 208 is removed to expose the polysilicon layer 204. The remaining conductive layer 208a and the remaining barrier layer 206a constitute a metal gate.

Figure 2C:
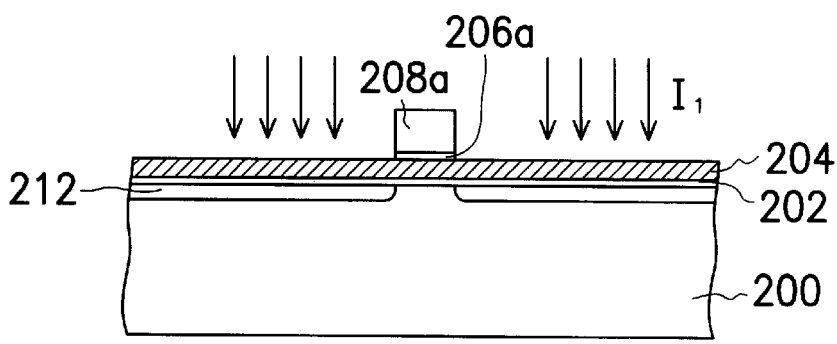

In FIG. 2C, the photoresist layer 210 is removed. A first ion implantation $I_1$ is performed to form a lightly doped region 212 within the substrate 200 around the position of the conductive layer 208. The lightly doped region 212 has a second electric type. The lightly doped region 212 has a shallower junction than a conventional lightly doped region since the dopant is doped into the substrate 200 through the polysilicon layer 204 and the gate oxide layer 202. The shallower junction formed by the invention can prevent a short channel effect more effectively than a shallow junction formed by a conventional method.

Figure 2D:
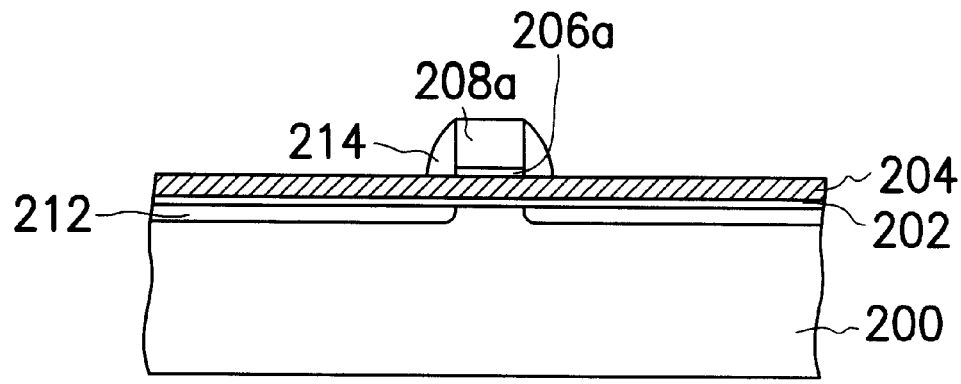

In FIG. 2D, a spacer 214 is formed on the polysilicon layer 204 around the remaining conductive layer 208a and the remaining barrier layer 206a. Forming the spacer 214 comprises steps of forming an insulating layer on the structure shown in FIG. 2C and removing a part of the insulating layer using etching back or other similar anisotropic etching process. A preferred material of the spacer 214 comprises silicon oxide, silicon nitride or silicon-oxy-nitride.

Figure 2E:
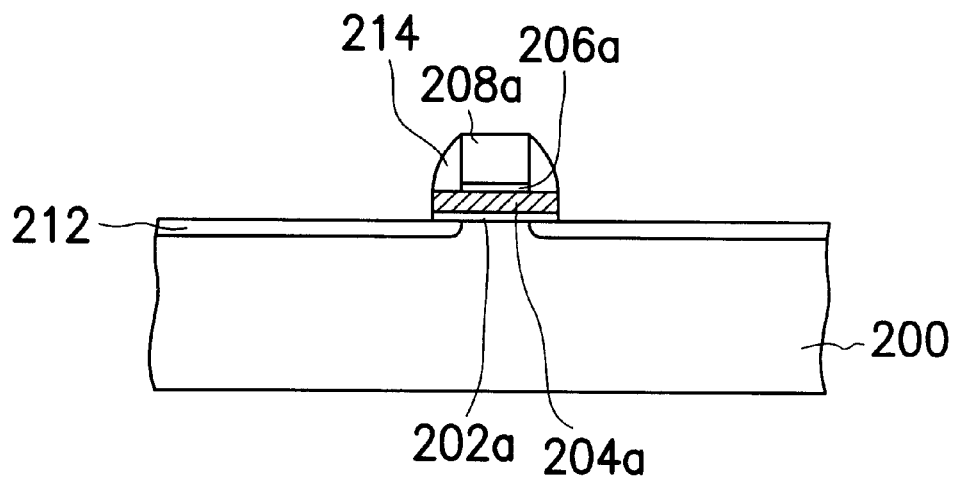

In FIG. 2E, a part of the polysilicon layer 204 and a part of the gate oxide layer are removed to expose the substrate 200 using the remaining conductive layer 208a and the spacer 214 as a mask. The remaining polysilicon layer 204a, the barrier layer 206a and the conductive layer 208a constitute a gate structure with an inverted, T-shaped cross-section.

Figure 2F:
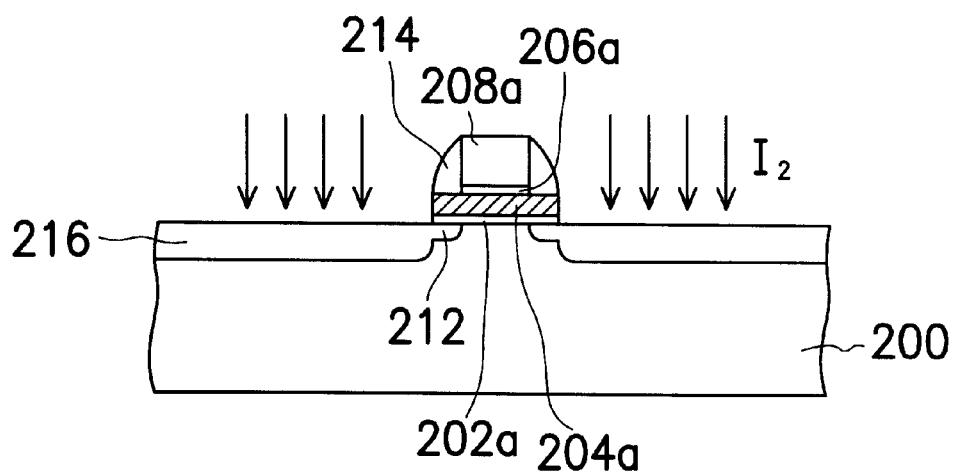

In FIG. 2F, a second ion implantation $I_2$ is performed to form heavily doped regions 216 as source/drain regions in the substrate 200. The heavily doped regions 216 have the second electric type and are positioned below two sides of the gate structure. A MOS transistor is thus completed.

It may be seen that the first electric type and the second electric type are inverses of each other. If the first electric type represents P-type, the second electric type represents N-type. On the other hand, if the first electric type represents N-type, the second electric type represents P-type.

In general, an etching process comprises a main etching step and an over etching step. The main etching step is performed until exposing an interface between an upper layer, which is etched, and a lower layer under the upper layer. Of the main etching step, the etching rate is faster than that of the over-etching but the selectivity is worse. After performing the main etching, there may be a part of the upper layer remaining on the lower layer from unequal etching. The over-etching step with a higher selectivity than the main etching step is thus performed to ensure that the upper layer is fully removed fully.

The gate of a conventional MOS is only formed from a polysilicon layer so that the thickness of the polysilicon layer is thicker than the thickness of the polysilicon layer of the invention. Since a conventional method requires a longer time for main etching to form the gate than the invention, the thin gate oxide layer of the conventional MOS is etched easily from unequally etching during the main etching. In the invention, the polysilicon layer is thin. The main etching step is performed with a higher selectivity and the time for performing the main etching is shorter than for a conventional technique. The gate oxide layer of a MOS transistor of the invention can be prevented from being etched. The thickness of the gate oxide layer of the invention thus can be thinner than a conventional gate oxide layer.

One feature of the invention is that the lightly doped region is formed using ion implantation penetrating the polysilicon layer and the gate oxide layer. A junction is formed between the lightly doped region and the substrate. The junction is shallower than a convention junction. The shallower junction can further prevent short channel effect.

Another feature of the invention is that the polysilicon layer used to form a gate is thinner than a conventional polysilicon layer. The etching window of the main etching is improved to avoid destruction of the gate oxide layer.

Yet another feature of the invention is that the gate structure comprises the polysilicon layer and the conductive layer wherein both have a low resistance. The resistance of the gate structure is thus lower than the gate of a conventional MOS transistor.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for forming a gate structure, comprising the steps of:
    providing a substrate with a first electric type;
    forming a gate oxide layer on the substrate;
    forming a polysilicon layer on the gate oxide layer;
    forming a barrier layer on the polysilicon layer;
    forming a conductive layer on the barrier layer;
    patterning the conductive layer to expose a portion of the polysilicon layer;
    performing a first ion implantation through the polysilicon layer and the gate oxide layer to form lightly doped regions with a second electric type in the substrate around the remaining conductive layer;
    forming a spacer on the side-wall of the remaining conductive layer and the remaining barrier layer; and
    removing the exposed polysilicon layer and the gate oxide layer under the polysilicon layer to form a gate structure.

2. The method according to claim 1, wherein the polysilicon layer has a thickness of about 300–1000 Å.

3. The method according to claim 1, wherein the conductive layer has a thickness of about 200–500 Å.

4. The method according to claim 1, wherein a material of the conductive layer comprises tungsten.

5. The method according to claim 1, wherein a material of the barrier layer comprises titanium nitride.

6. The method according to claim 1, wherein a material of the spacer is selected from a group consisting of silicon nitride, silicon oxide and silicon-oxy-nitride.

7. The method according to claim 1, wherein the first electric type is P-type and the second electric type is N-type.

8. The method according to claim 1, wherein the first electric type is N-type and the second electric type is P-type.

9. A method for forming a metal-oxide-semiconductor transistor, comprising the steps of:

providing a substrate with a first electric type;

forming a gate oxide layer on the substrate;

forming a polysilicon layer on the gate oxide layer;

forming a barrier layer on the polysilicon layer;

forming a conductive layer on the barrier layer;

patterning the conductive layer to expose a portion of the polysilicon layer;

performing a first ion implantation through the polysilicon layer and the gate oxide layer to form lightly doped regions with a second electric type in the substrate around the remaining conductive layer;

forming a spacer on the side-wall of the remaining conductive layer;

removing the exposed polysilicon layer and the gate oxide layer under the polysilicon layer; and forming source/drain regions in the substrate on two sides of the remaining polysilicon layer.

10. The method according to claim 9, wherein the polysilicon layer has a thickness of about 300–1000 Å.

11. The method according to claim 9, wherein the conductive layer has a thickness of about 200–500 Å.

12. The method according to claim 9, wherein a material of the conductive layer comprises tungsten.

13. The method according to claim 9, wherein a material of the spacer is selected from a group consisting of silicon nitride, silicon oxide and silicon-oxy-nitride.

14. The method according to claim 9, wherein the first electric type is P-type and the second electric type is N-type.

15. The method according to claim 9, wherein the first electric type is N-type and the second electric type is P-type.

16. A method for forming a metal-oxide-semiconductor transistor, comprising the steps of:

providing a substrate with a first electric type;

forming a gate oxide layer on the substrate;

forming a polysilicon layer on the gate oxide layer;

forming a barrier layer on the polysilicon layer;

forming a conductive layer on the barrier layer;

forming a patterned photoresist layer on the conductive layer;

removing a portion of the conductive layer using the barrier layer as an etching stop layer;

removing the patterned photoresist layer;

performing a first ion implantation through the polysilicon layer and the gate oxide layer to form lightly doped regions with a second electric type in the substrate around the remaining conductive layer;

forming a spacer on the side-wall of the remaining conductive layer and on the side-wall of the remaining barrier layer;

removing a part of the polysilicon layer and a part of the gate oxide layer to expose the substrate using the remaining conductive layer and the spacer as a mask, wherein the remaining polysilicon layer, the barrier layer, and the conductive layer constitute a gate structure with an inverted, t-shaped cross-section; and performing a second ion implantation to form heavily doped source/drain regions in the substrate on two sides of the remaining polysilicon layer.

* * * * *